(12) United States Patent
Zhu

(10) Patent No.: US 12,295,212 B2
(45) Date of Patent: May 6, 2025

(54) DISPLAY PANEL, DISPLAY DEVICE, AND METHOD OF MANUFACTURING DISPLAY PANEL

(71) Applicant: BOE TECHNOLOGY GROUP CO., LTD., Beijing (CN)

(72) Inventor: Jianchao Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 909 days.

(21) Appl. No.: 17/353,927

(22) Filed: Jun. 22, 2021

(65) Prior Publication Data
US 2022/0123091 A1    Apr. 21, 2022

(30) Foreign Application Priority Data

Oct. 16, 2020 (CN) .......................... 202011109737.9

(51) Int. Cl.
*H10K 59/122* (2023.01)
*H10K 59/124* (2023.01)
(Continued)

(52) U.S. Cl.
CPC ......... *H10K 59/122* (2023.02); *H10K 59/124* (2023.02); *H10K 59/131* (2023.02);
(Continued)

(58) Field of Classification Search
CPC .. H10K 59/131; H10K 59/122; H10K 59/124; H10K 71/00; H10K 59/1201;
(Continued)

(56) References Cited

U.S. PATENT DOCUMENTS

2016/0260792 A1* 9/2016 Kim ................. H10K 59/80515
2019/0006442 A1* 1/2019 Byun ................... H10K 59/873
(Continued)

FOREIGN PATENT DOCUMENTS

CN   109786434 A   5/2019
CN   110610980 A   12/2019

OTHER PUBLICATIONS

Chinese application No. 202011109737.9, First Examination Opinion Notification, Issued Jan. 10, 2025.

*Primary Examiner* — Kevin Quarterman
(74) *Attorney, Agent, or Firm* — DINSMORE & SHOHL LLP

(57) ABSTRACT

A display panel, a display device, and a method of manufacturing the display panel is disclosed. The display panel includes a plurality of sub-pixel units, each sub-pixel unit includes a first metal layer, a first planarization layer, a first electrode layer, a pixel definition layer, a light-emitting layer, and a second electrode layer that are sequentially stacked in this order, wherein the first metal layer comprises at least one longitudinal wire, the first metal layer, the pixel definition layer, the first electrode layer, and the second electrode layer employ an axial symmetry structure respectively; when the number of the longitudinal wires is odd, a longitudinal wire at center is taken as a symmetry axis of the axial symmetry structure; and when the number of the longitudinal wires is even, a center line between two longitudinal wires at outermost edges is taken as the symmetry axis of the axial symmetry structure.

12 Claims, 13 Drawing Sheets

(51) Int. Cl.
   *H10K 59/131* (2023.01)
   *H10K 59/80* (2023.01)
   *H10K 71/00* (2023.01)
   *H10K 59/12* (2023.01)

(52) U.S. Cl.
   CPC . *H10K 59/80515* (2023.02); *H10K 59/80521* (2023.02); *H10K 71/00* (2023.02); *H10K 59/1201* (2023.02)

(58) Field of Classification Search
   CPC ....... H10K 59/80515; H10K 59/80521; H10K 59/352; H10K 59/121
   See application file for complete search history.

(56) References Cited

U.S. PATENT DOCUMENTS

2020/0388666 A1* 12/2020 Park .................. H10K 77/111
2021/0149524 A1* 5/2021 Bang .................. G06F 3/04164

* cited by examiner

DISPLAY PANEL, DISPLAY DEVICE, AND METHOD OF MANUFACTURING DISPLAY PANEL

CROSS-REFERENCE TO RELATED APPLICATIONS

This application claims the priority to the Chinese Patent Application No. 202011109737.9, filed on Oct. 16, 2020, the disclosure of which is incorporated herein by reference in its entirety.

TECHNICAL FIELD

The present disclosure relates generally to the field of display technologies, and in particular, to a display panel, a display device, and a method of manufacturing the display panel.

BACKGROUND

An Organic Light Emitting Diode (OLED) display has become a research hotspot due to its advantages of self-luminescence, high contrast, thin thickness, wide viewing angle, fast response, flexibility, and wide operating temperature range and the like.

An organic light-emitting diode generally includes an anode, a cathode, and a light-emitting layer sandwiched between the two electrodes, and the light-emitting layer includes at least one hole transport layer, one light-emitting layer, and one electron transport layer. A semiconductor microcavity formed by the anode and the cathode is an optical structure for narrowing spectrum, and photons generated in the light-emitting layer are limited in the cavity formed by two mirrors. Therefore, luminescence property of the light-emitting diode not only depends on inherent property of an organic light-emitting material, but also have a certain correlation with the morphology of the anode, the cathode or the like. Improper anode or cathode design will cause color cast or color separation.

SUMMARY

In view of the above drawbacks or deficiencies in the prior art, it is desirable to provide a display panel and a display device for preventing color cast and color separation.

In a first aspect, there is provided a display panel comprising a plurality of sub-pixel units, each of the plurality of sub-pixel units comprises:
a first metal layer, wherein the first metal layer comprises one longitudinal wire or a plurality of longitudinal wires uniformly arranged side by side, and the first metal layer employs an axial symmetry structure;
a first planarization layer;
a first electrode layer, wherein the first electrode layer employs the axial symmetry structure;
a pixel definition layer, wherein the pixel definition layer employs the axial symmetry structure;
an light-emitting layer; and
a second electrode layer, wherein the second electrode layer employs the axial symmetry structure;
wherein the first metal layer, the first planarization layer, the first electrode layer, the pixel definition layer, the light-emitting layer and the second electrode layer are stacked in this order; and
when the number of the longitudinal wires is odd, a longitudinal wire at center is taken as a symmetry axis of the axial symmetry structure; and when the number of the longitudinal wires is even, a center line between two longitudinal wires at outermost edges is taken as the symmetry axis of the axial symmetry structure.

In some embodiments, the first metal layer of the sub-pixel unit is provided with one longitudinal wire; and
the first electrode layer of the sub-pixel unit comprises one protrusion, and the protrusion employs the axial symmetry structure with the longitudinal wire as the symmetry axis.

In some embodiments, the pixel definition layer of the sub-pixel unit comprises one pixel opening, and the pixel opening employs the axial symmetry structure with the longitudinal wire as the symmetry axis; and
the second electrode layer of the sub-pixel unit comprises one recess, and the recess employs the axial symmetry structure with the longitudinal wire as the symmetry axis.

In some embodiments, an orthographic projection of the pixel opening on the first metal layer of the sub-pixel unit covers the longitudinal wire.

In some embodiments, the first metal layer of the sub-pixel unit is provided with two longitudinal wires; and
the first electrode layer of the sub-pixel unit comprises two protrusions located directly above the longitudinal wires respectively.

In some embodiments, the pixel definition layer of the sub-pixel unit comprises one pixel opening, the pixel opening employs the axial symmetry structure with the center line between the two longitudinal wires as the symmetry axis; and
the second electrode layer of the sub-pixel unit comprises one recess, and the recess employs the axial symmetry structure with the center line between the two longitudinal wires as the symmetry axis.

In some embodiments, an orthographic projection of the pixel opening on the first metal layer covers the two longitudinal wires.

In a second aspect, there is provided a display device comprising the display panel provided in the embodiments of the present disclosure.

In a third aspect, there is provided a method of manufacturing a display panel, comprising:
forming a back plate on a substrate, wherein the back plate comprises a first metal layer and a first planarization layer that are stacked in this order, and the first metal layer of one sub-pixel unit comprises one longitudinal wire;
forming a first electrode layer, wherein the first electrode layer comprises one protrusion, the protrusion takes the longitudinal wire as a symmetry axis;
forming a pixel definition layer, wherein the pixel definition layer is provided with a pixel opening, the pixel opening takes the longitudinal wire as the symmetry axis;
forming an light-emitting layer; and
forming a second electrode layer, wherein the second electrode layer comprises one recess, the recess takes the longitudinal wire as the symmetry axis.

In a fourth aspect, there is provided a method of manufacturing a display panel, comprising:
forming a back plate on a substrate, wherein the back plate comprises a first metal layer and a first planarization layer that are stacked in this order, the first metal layer of one sub-pixel unit comprises two longitudinal wires;

forming a first electrode layer, wherein the first electrode layer comprises two protrusions that are respectively located directly above the longitudinal wires;

forming a pixel definition layer, wherein the pixel definition layer is provided with a pixel opening, the pixel opening takes a center line between the two longitudinal wires as a symmetry axis;

forming a light-emitting layer; and forming a second electrode layer, wherein the second electrode layer comprises one recess, the recess takes the center line between the two longitudinal wires as the symmetry axis.

According to the technical solution provided by the embodiments of the present disclosure, the first metal layer, the pixel definition layer, the first electrode layer and the second electrode layer of the sub-pixel unit employ the axial symmetry structures respectively, and can solve the problems of color cast and color separation in the display panel.

BRIEF DESCRIPTION OF THE DRAWINGS

Other features, objectives and advantages of the present disclosure will become more apparent by reading the detailed description of non-restrictive embodiments made with reference to the following drawings.

DETAILED DESCRIPTION

Figure 1:
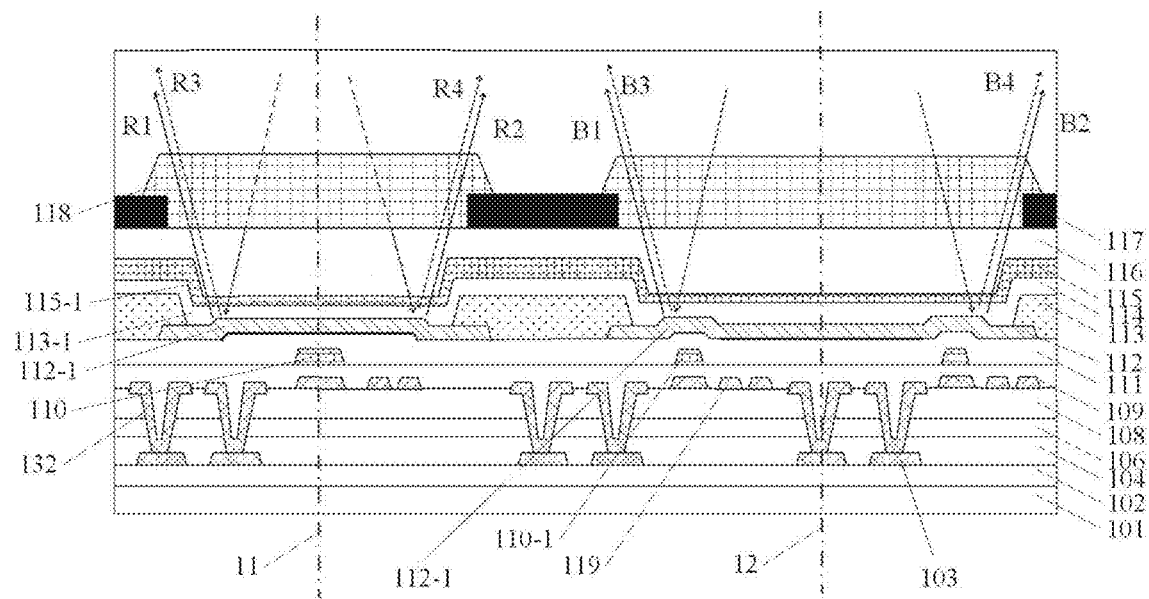
FIG. 1 illustrates an exemplary structural block diagram of a display panel according to an embodiment of the present disclosure.

The present disclosure is further described in detail below with reference to the accompanying drawings and embodiments. It can be understood that the specific embodiments described herein are merely used to explain the related invention and not to limit the invention. In addition, it should be noted that, for ease of description, only portions related to the present invention are shown in the accompanying drawings.

Unless defined otherwise, technical or scientific terms used herein should have the same meanings as those commonly understood by one of ordinary skill in the art to which this invention belongs. The terms "first," "second," and the like, used in this disclosure, do not indicate any sequence, number, or importance, but is only used to distinguish different components. The terms "comprising" or "including", or the like, means that an element or object preceding the term covers a listed element or object following the term and its equivalent, rather than precluding another element or object. The term "connected", or "coupled", or the like, is not limited to a physical or mechanical connection, but can include an electrical connection, whether direct or indirect. The terms "upper", "lower", "left", "right" and so on, are only used to indicate relative position relations, and when an absolute position of a described object changes, the relative position relations can also change accordingly.

It should be noted that, the embodiments in the present disclosure and the features in the embodiments can be combined with each other without conflict. The present disclosure will be described in detail below with reference to the accompanying drawings in conjunction with the embodiments.

Inventors have found that an existing display panel has the following problems: at present the organic light-emitting diode generally includes an anode, a cathode and an light-emitting layer sandwiched between the two electrodes, and the light-emitting layer includes at least one hole transport layer, one light-emitting layer and one electron transport layer. A semiconductor microcavity formed by the anode and the cathode is an optical structure for narrowing spectrum, and photons generated in the light-emitting layer are limited in the cavity formed by the two mirrors. Therefore, luminescence property of the light-emitting diode not only depends on inherent property of an organic light-emitting material itself, but also has a certain correlation with morphology of the anode, the cathode or the like. Improper anode or cathode design will cause color cast or color separation. For example, in a sub-pixel unit, if light intensities emitted from various parts of the light-emitting layer are different, or light intensities seen at a same viewing angle are different, an image with color cast will be seen by a viewer. In addition, after incidence of outside light to the display panel, it is reflected by a portion of the metal layer (e.g., the anode, the cathode) forming reflected light, and when light intensities of the reflected light seen at the same viewing angle are different, an image with color separation will be seen by the viewer. Therefore, a reasonable display panel structure is employed to enable the light intensities emitted from the display panel at the same viewing angle to be identical, and the light intensities reflected by the display panels at the same viewing angle to be identical.

In order to solve the above technical problems, the present disclosure provides the following display panel.

Referring to FIG. 1, a schematic structural diagram of a display panel is given. The display panel includes a plurality of sub-pixel units, each of the plurality of sub-pixel units includes a first metal layer 110, a first planarization layer 111, a first electrode layer 112, a pixel definition layer 113, an light-emitting layer 114 and a second electrode layer 115 that are sequentially stacked in this order, wherein the first metal layer 110 includes one longitudinal wire 110-1, or a plurality of longitudinal wires 110-1 uniformly arranged side by side;

the first metal layer 110, the first electrode layer 112, the pixel definition layer 113 and the second electrode layer 115 employ axial symmetry structures respectively, wherein when the number of the longitudinal wires 110-1 is odd, a longitudinal wire at a center is taken as a symmetry axis 11 of the symmetry structure; and when the number of the longitudinal wires 110-1 is even, a center line between two longitudinal wires at outermost edges is taken as a symmetry axis 12 of the symmetry structure.

As shown in FIG. 1, the first planarization layer 111, the first electrode layer 112, the pixel definition layer 113, the light-emitting layer 114, and the second electrode layer 115 are sequentially stacked in this order on the first metal layer 110, wherein the first electrode layer 112 changes with the structure of the first metal layer 110 forming a protrusion 112-1, such that the thickness of the light-emitting layer 114 formed between the first electrode layer 112 and the second electrode layer 115 is uneven, thereby resulting in uneven light intensity emitted from the light-emitting layer 114 and uneven light intensity of outside light reflected by the first electrode layer 112. Therefore, the first metal layer 110, the first electrode layer 112, the pixel definition layer 113 and the second electrode layer 115 are respectively provided as the axial symmetry structures, so that the light intensities of light emitted from the light-emitting layer on both sides of the symmetry axis are identical, for example, light intensities of rays R1 and R2 emitted from positions with the same distance from the symmetry axis 11 are equal, light intensities of rays B1 and B2 emitted from positions with the same distance from the symmetry axis 12 are equal, light intensities of reflected rays R3 and R4 reflected from positions with the same distance from the symmetry axis 11 are equal, and light intensities of reflected rays B3 and B4 reflected from positions with the same distance from the symmetry axis 12 are equal. The first metal layer 110 can transmit a signal as needed, for example, a power signal in a pixel driving circuit, which is not limited herein.

Figure 2:
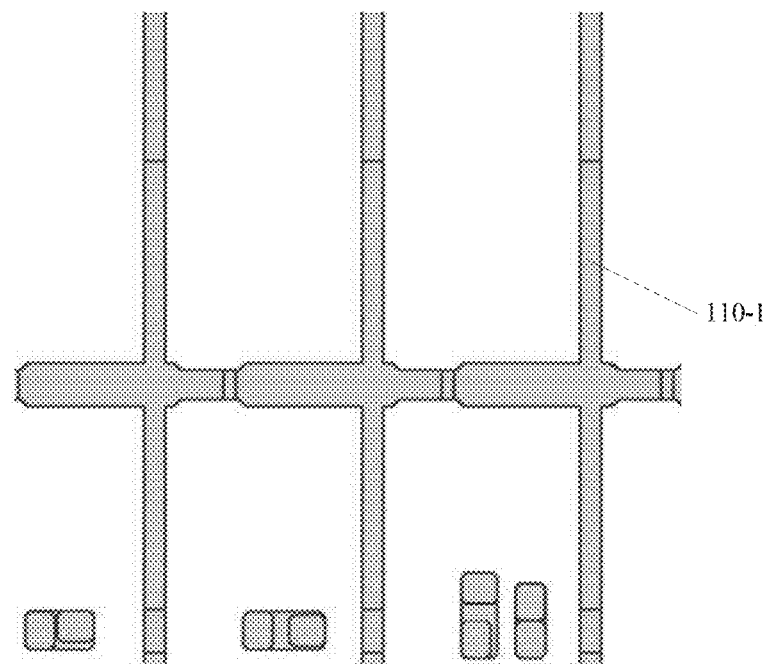
FIG. 2 illustrates an exemplary top view of a first metal layer of FIG. 1.
Figure 3:
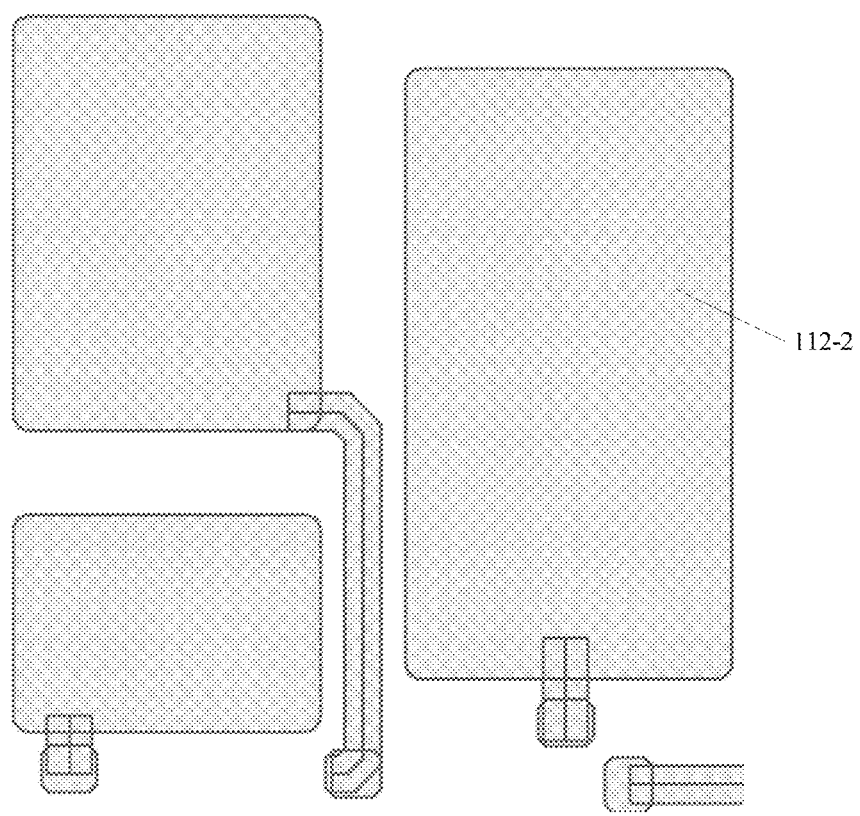
FIG. 3 illustrates an exemplary top view of a first electrode of FIG. 1.
Figure 4:
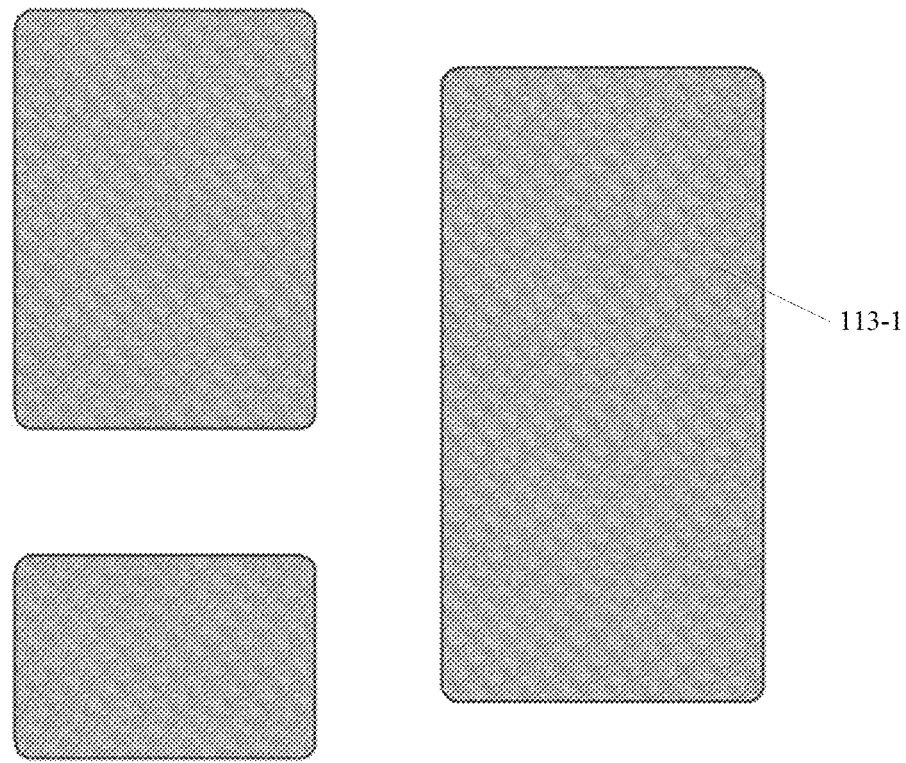
FIG. 4 illustrates an exemplary top view of a pixel opening of FIG. 1.
Figure 5:
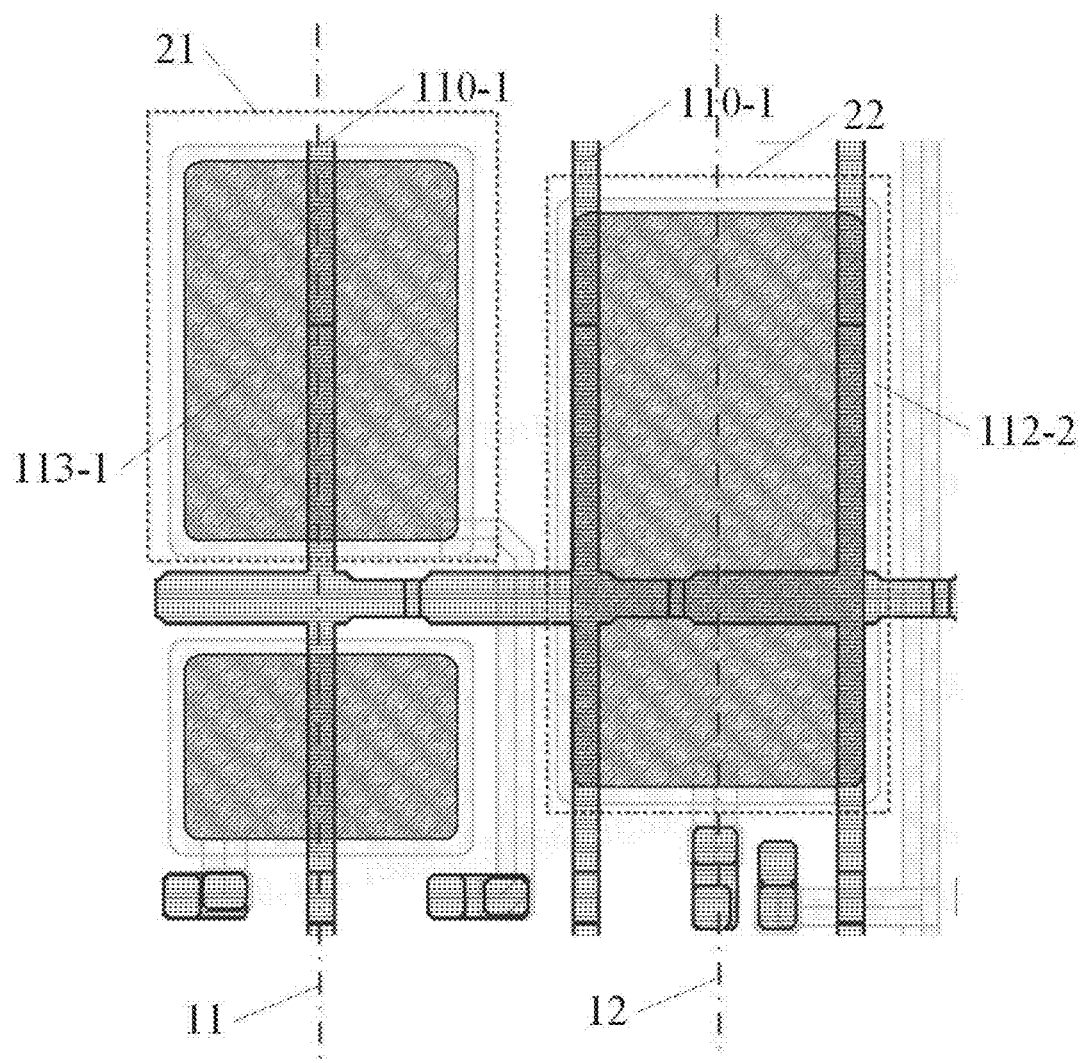
FIG. 5 illustrates an exemplary top view of stacking of the first metal layer, the first electrode, and the pixel opening of FIG. 1.

Referring to FIGS. 1 to 5, FIG. 2 illustrates an exemplary top view of a first metal layer 110 of FIG. 1; FIG. 3 illustrates an exemplary top view of a first electrode of FIG. 1; FIG. 4 illustrates an exemplary top view of a pixel opening 113-1 of FIG. 1; and FIG. 5 illustrates an exemplary top view of stacking of the first metal layer 110, the first electrode and the pixel opening 113-1 of FIG. 1;

in some embodiments, the first metal layer 110 of the sub-pixel unit 21 is provided with one longitudinal wire 110-1;

the first electrode layer 112 of the sub-pixel unit 21 includes one protrusion 112-1, and the protrusion 112-1 employs an axial symmetry structure with the longitudinal wire 110-1 as a symmetry axis.

It should be noted that, strictly speaking, the symmetry axis 11 herein can be understood as a center line 11 of the longitudinal wire 110-1. When ignoring the width of the longitudinal wire 110-1, the symmetry axis 11 can be considered to be the longitudinal wire 110-1. The present disclosure employs the latter statement for ease of illustration.

At this time, the reflected light formed by the outside light via the first electrode layer 112 is symmetric about the longitudinal wire 110-1 as the symmetry axis. For example, the reflected rays R3 and R4 at the positions with the same distance from the longitudinal wire 110-1 have the same emergence angles and the equal light intensities, which prevents the occurrence of color separation.

In some embodiments, the pixel definition layer 113 of the sub-pixel unit 21 includes one pixel opening 113-1, and the pixel opening 113-1 employs the axial symmetry structure with the longitudinal wire 110-1 as the symmetry axis;

the second electrode layer 115 of the sub-pixel unit 21 includes one recess 115-1, and the recess 115-1 employs the axial symmetry structure with the longitudinal wire 110-1 as the symmetry axis.

Provided by the embodiment is a case where one sub-pixel unit includes one longitudinal wire, at this time, the protrusion 112-1, the recess 115-1, and the pixel opening 113-1 are respectively symmetric about the longitudinal wire 110-1 as the symmetry axis, thus the light-emitting layer 114 between the first electrode layer 112 and the second electrode layer 115 is also symmetric about the longitudinal wire 110-1 as the symmetry axis. At this time, a light-emitting layer, which is symmetric about the longitudinal wire 110-1 as the symmetry axis, is formed in the sub-pixel unit 21. Therefore, the light intensities of the rays emitted from the light-emitting layer are also symmetric about the longitudinal wire 110-1 as the symmetry axis, for example, the emergency light R1 and R2 at the positions with the same distance from the longitudinal wire 110-1 have the same emergence angles and the equal light intensities, which prevents the occurrence of color cast.

As shown in FIGS. 1 and 5, in some embodiments, an orthographic projection of the pixel opening 113-1 on the first metal layer of the sub-pixel unit 21 covers the longitudinal wire 110-1. FIGS. 2, 3 and 4 provide top views of the first metal layer 110, the first electrode layer 112 and the pixel opening 113-1, respectively, and FIG. 5 provides a stacked structure diagram of the above three. As shown in FIG. 2, the first metal layer is provided with the longitudinal wires 110-1 uniformly arranged side by side; as shown in FIG. 3, the first electrode layer is provided with a first electrode block 112-2; as shown in FIG. 4, the pixel definition layer is provided with the pixel opening 113-1; and as shown in FIG. 5, the pixel opening 113-1 and the first electrode block 112-2 of the sub-pixel unit 21 respectively employ the symmetry structures with the longitudinal wire 110-1 as the symmetry axis, and the orthographic projection of the pixel opening 113-1 of the sub-pixel unit 21 on the first metal layer covers the longitudinal wire 110-1 as shown.

Referring to FIG. 1 to FIG. 5, in some embodiments, the first metal layer 110 of the sub-pixel unit 22 is provided with two longitudinal wires;

the first electrode layer 112 of the sub-pixel unit 22 includes two protrusions 112-1, and the two protrusions 112-1 are respectively located directly above the longitudinal wires 110.

Provided by the embodiment is a case where the sub-pixel unit includes two longitudinal wires, the reflected light formed by the outside light via the first electrode layer is symmetric about a center line 12 of the two longitudinal wires as a symmetry axis. The reflected light R3 and R4 reflected from positions with the same distance from the center line 12 have the same emergence angles and the equal light intensities, which prevents the occurrence of color separation.

In some embodiments, the pixel definition layer 113 of the sub-pixel unit 22 includes one pixel opening 113-1, and the pixel opening 113-1 employs the axial symmetry structure with the center line 12 of the two longitudinal wires as the symmetry axis; and the second electrode layer 115 of the sub-pixel unit 22 includes one recess 115-1, and the recess 115-1 employs the axial symmetry structure with the center line 12 of the two longitudinal wires 110-1 as the symmetry axis.

At this time, the protrusion 112-1, the recess 115-1, and the pixel opening 113-1 are respectively symmetric about the center line 12 as the symmetry axis, so that the light-emitting layer 114 between the first electrode layer 112 and the second electrode layer 115 is also symmetric about the center line 12 as the symmetry axis. At this time, the light-emitting layer, which is symmetric about the center line 12 as the symmetry axis, is formed in the sub-pixel unit 22. Therefore, the light intensities of the rays emitted from the light-emitting layer 114 are also symmetric about the center line 12 as the symmetry axis, for example, the emitted light B1 and B2 emitted from positions at the same distance from the center line 12 have the same emergence angles and the equal light intensities, which prevents the occurrence of color cast.

As shown in FIGS. 1 and 5, in some embodiments, an orthographic projection of the pixel opening 113-1 on the first metal layer of the sub-pixel unit 22 covers the two longitudinal wires 110-1. FIGS. 2, 3 and 4 provide top views of the first metal layer 110, the first electrode layer 112 and the pixel opening 113-1, respectively, and FIG. 5 provides a stacked structure diagram of the above three. As shown in FIG. 2, the first metal layer is provided with the longitudinal wires 110-1 uniformly arranged side by side; as shown in FIG. 3, the first electrode layer is provided with the first electrode block 112-2; as shown in FIG. 4, the pixel definition layer is provided with the pixel opening 113-1; and as shown in FIG. 5, the pixel opening 113-1 and the first electrode block 112-2 of the sub-pixel unit 22 respectively have the symmetry structures with the center line 12 between the longitudinal wires 110-1 as the symmetry axis, and the orthographic projection of the pixel opening 113-1 of the sub-pixel unit 22 on the first metal layer covers the two longitudinal wires 110-1 as shown.

It should be noted that each sub-pixel unit of the display panel can include one longitudinal wire, or each sub-pixel unit can include two longitudinal wires, or some sub-pixel units include one longitudinal wire and other sub-pixel units include two longitudinal wires. The above structure is not limited herein, and is set according to an application scenario.

In addition, one sub-pixel unit further includes a plurality of longitudinal wires, and at this time, the symmetry axis can be determined according to the number of the longitudinal wires. When the number of the longitudinal wires is odd, a longitudinal wire at center is taken as the symmetry axis of the symmetry structure, for example, when the number of the longitudinal wires is 3, a longitudinal wire at center is taken as the symmetry axis; when the number of the longitudinal wires is even, a center line between two longitudinal wires at outermost edges is taken as the symmetry axis of the symmetry structure, for example, when the number of the longitudinal wires is 2, a center line between the two longitudinal wires is taken as the symmetry axis.

A specific example of a display panel is given below with reference to FIGS. 1 to 5. The sub-pixel unit 21 includes one longitudinal wire, and the sub-pixel unit 22 includes two longitudinal wires. The display panel includes a substrate 101, a buffer layer 102, a back plate, an electroluminescent device, an encapsulation layer 116, a black matrix 117 and a color film 118 that are sequentially stacked in this order. The back plate herein includes an active layer 103, a first insulating layer 104, a first gate layer (not shown, and located between the first insulating layer 104 and a second insulating layer 106), the second insulating layer 106, a second gate layer (not shown, and located between the second insulating layer 106 and a dielectric layer 108), the dielectric layer 108, a second metal layer 119, a second planarization layer 109, the first metal layer 110, and the first planarization layer 111, which are sequentially stacked in this order. The electroluminescent device includes the first electrode layer 112, the pixel definition layer 113, the light-emitting layer 114, and the second electrode layer 115, which are sequentially stacked in this order. The first electrode layer 112 herein is an anode, and the second electrode layer 115 is a cathode. The second metal layer 119 is connected to the active layer 103 through a via 132.

In addition, the first electrode layer 112, the pixel definition layer 113, the light-emitting layer 114 and the second electrode layer 115 of the sub-pixel unit 21 are arranged to be the symmetry structure with the longitudinal wire 110-1 as the symmetry axis. The first electrode layer 112, the pixel definition layer 113, the light-emitting layer 114, and the second electrode layer 115 of the sub-pixel unit 22 are arranged to be the symmetry structure with the center line 12 as the symmetry axis. This enables the display panel to avoid color cast and color separation.

Figure 6:
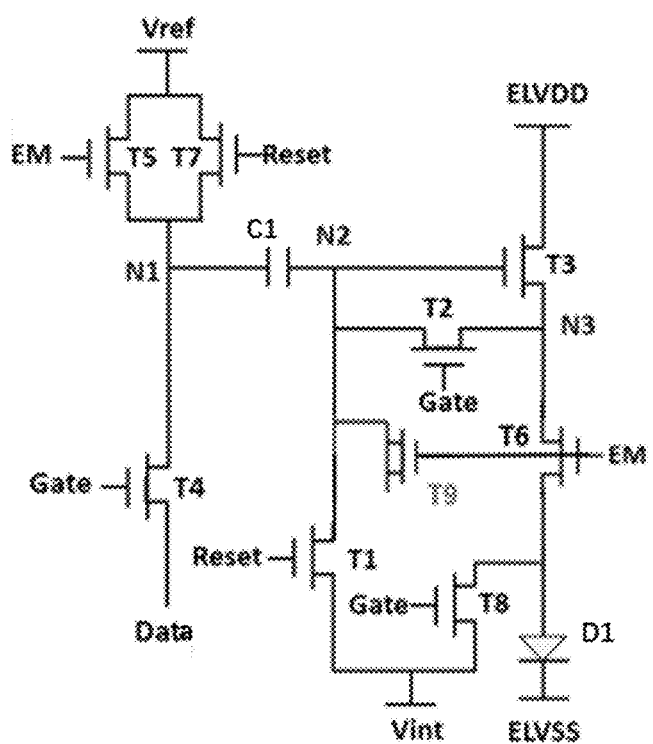
FIG. 6 illustrates an exemplary schematic diagram of a pixel driving circuit of the display panel of FIG. 1.

FIG. 6 illustrates an exemplary schematic diagram of a pixel driving circuit of the display panel of FIG. 1. The pixel driving circuit of the present disclosure employs an Active-Matrix (AM) type organic light emitting driving mode with a structure of 9T1C (i.e., 9 transistors and 1 capacitor). As shown in FIG. 1, the pixel driving circuit includes a plurality of signal lines, a plurality of TFTs connected to the signal lines, an energy storage capacitor C1, and an organic light-emitting diode Dl. The signal lines can be shared among the plurality of sub-pixels.

The TFT includes: a driving transistor T3, a first reset transistor T1, a second reset transistor T7, a data write transistor T4, a first light-emitting control transistor T5, a second light-emitting control transistor T6, a second compensation transistor T9, an initialization transistor T8, and a first compensation transistor T2.

Figure 7:
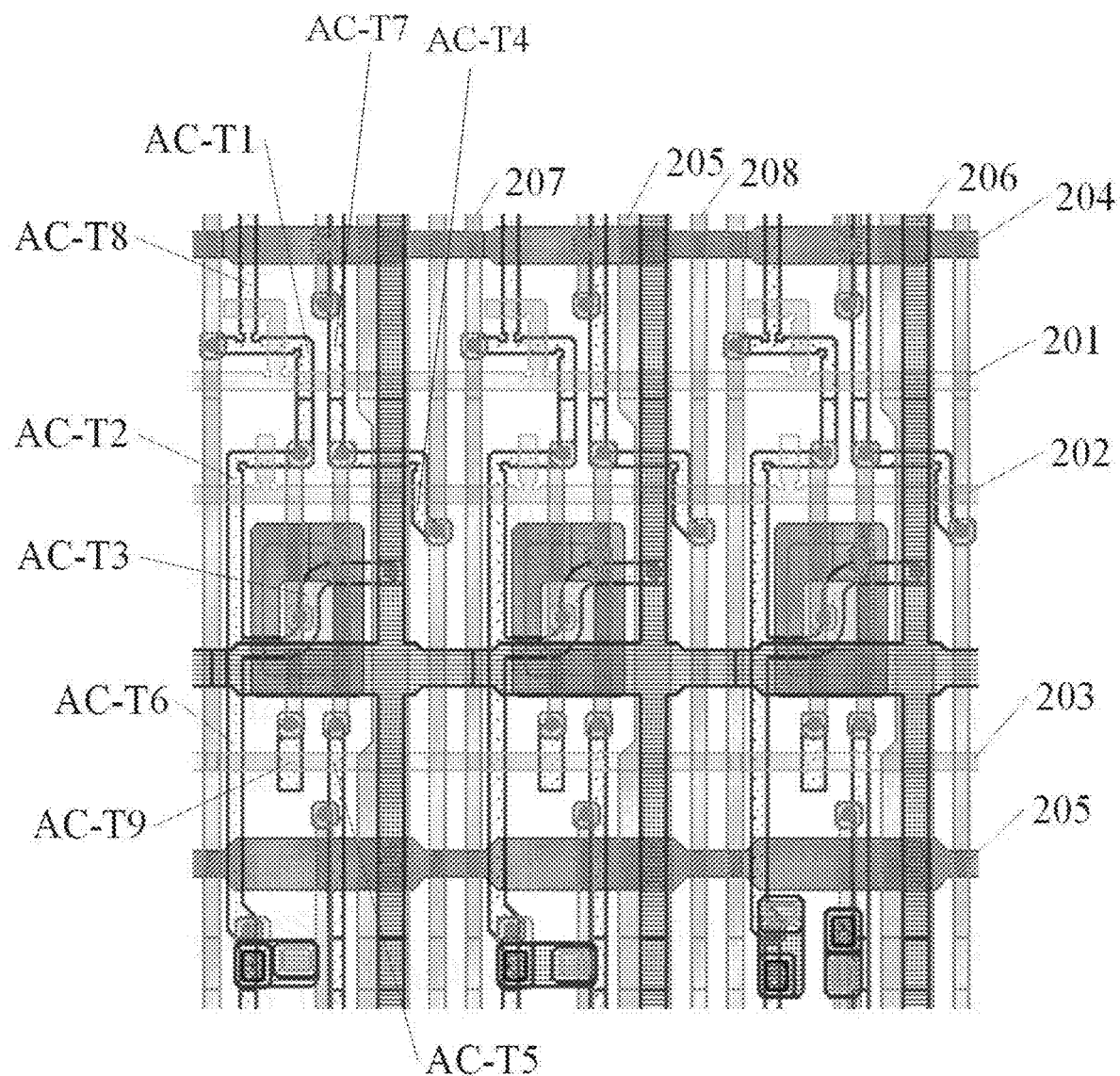
FIG. 7 illustrates an exemplary schematic diagram of a layout of TFT and capacitor of a sub-pixel.

As shown in FIG. 7, the signal line includes: a reset signal line 201 for transmitting a reset signal Reset; a gate signal line 202 for transmitting a gate signal Gate; a data signal line 208 for transmitting a data signal Data; a light-emitting control signal line 203 for transmitting a light-emitting control signal EM; an initialization voltage signal line 207 for transmitting an initialization voltage signal Vint, and a reference voltage signal line 204 for transmitting a reference voltage signal Vref. A power line includes a first power signal line 205 for transmitting a first power signal VDD, and a second power signal line 206 for transmitting a second power signal VSS.

The driving transistor T3 includes: a gate connected to a second pole of the energy storage capacitor C1, i.e., a second node N2; a first pole for receiving a first power signal ELVDD; and a second pole connected to a second pole of the first compensation transistor T2, i.e., a third node N3.

The first reset transistor T1 includes: a gate for receiving the reset signal Reset; a first pole connected to the second pole of the energy storage capacitor C1, i.e., the second node N2; and a second pole for receiving the initialization power signal Vint.

The second reset transistor T7 includes: a gate for receiving the reset signal Reset; a first pole for receiving the reference voltage signal Vref; and a second pole connected to a first pole of the energy storage capacitor, i.e., a first node N1.

The write transistor T4 includes: a gate for receiving a gate signal Gate; a first pole connected to the first node N1; and a second pole for receiving the data signal Data.

The first light-emitting transistor T5 includes: a gate for receiving the light-emitting control signal EM; a first pole for receiving the reference voltage signal Vref; and a second pole connected to the first node N1.

The second light-emitting transistor T6 includes: a gate for receiving the light-emitting control signal EM; a first pole connected to the third node N3; and a second pole connected to an anode of the light-emitting diode Dl.

The second compensation transistor T9 includes: a gate for receiving the light-emitting control signal EM; a first pole connected with a second pole and connected to the second node N2. In practice, the second compensation transistor T9 can be regarded as a compensation capacitor for compensating the voltage at N2.

The initialization transistor T8 includes: a gate for receiving the gate signal Gate; a first pole connected to the anode of the light-emitting diode Dl; and a second pole for receiving the initialization signal Vint.

Figure 8:
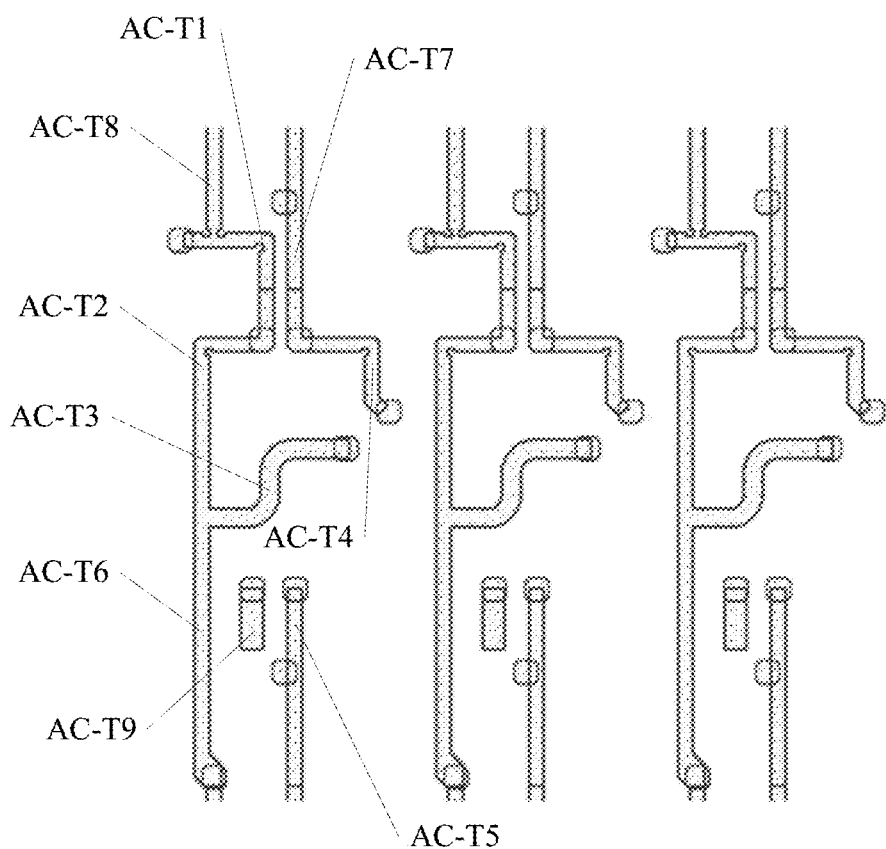
FIGS. 8 to 11 illustrate plan views of various layers in the layout of FIG. 7.
Figure 9:
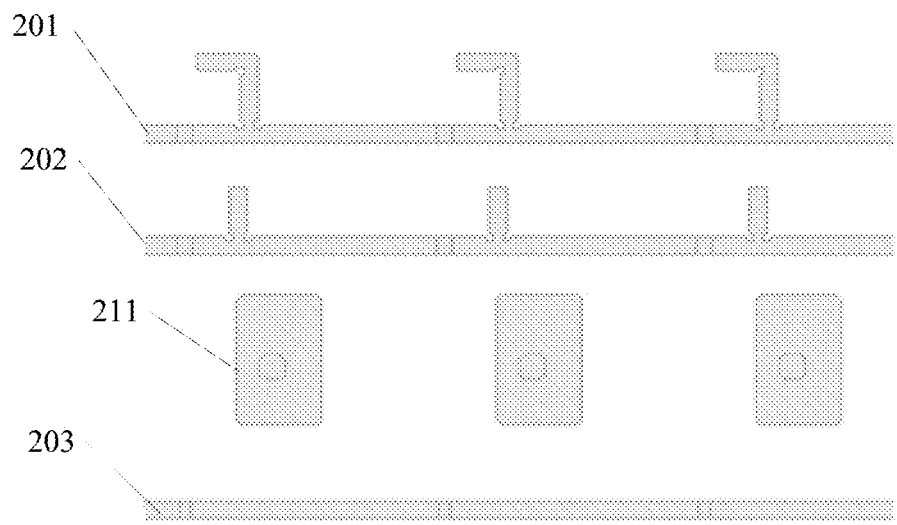
Figure 10:
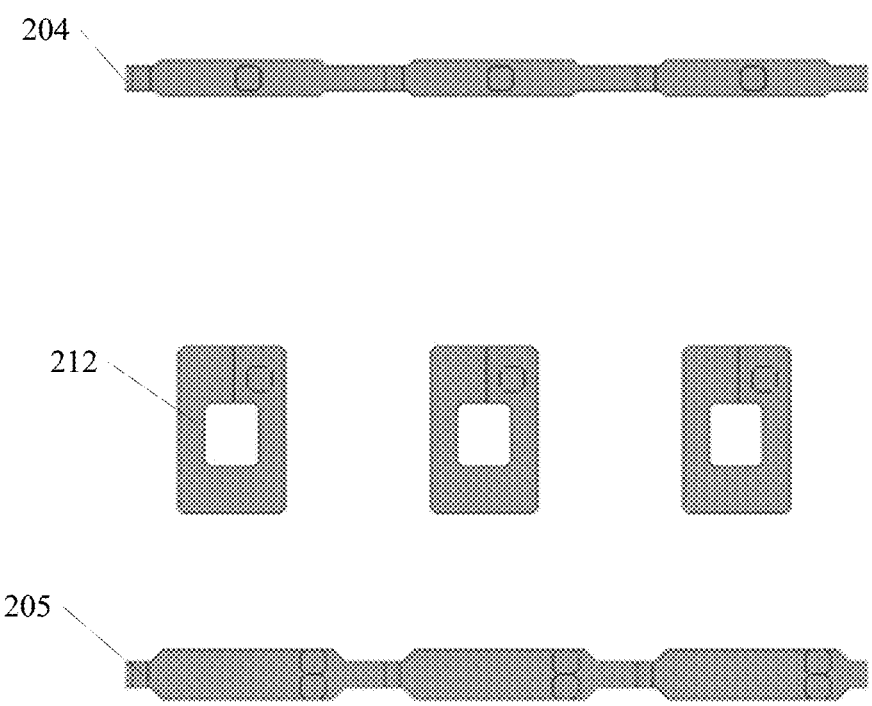
Figure 11:
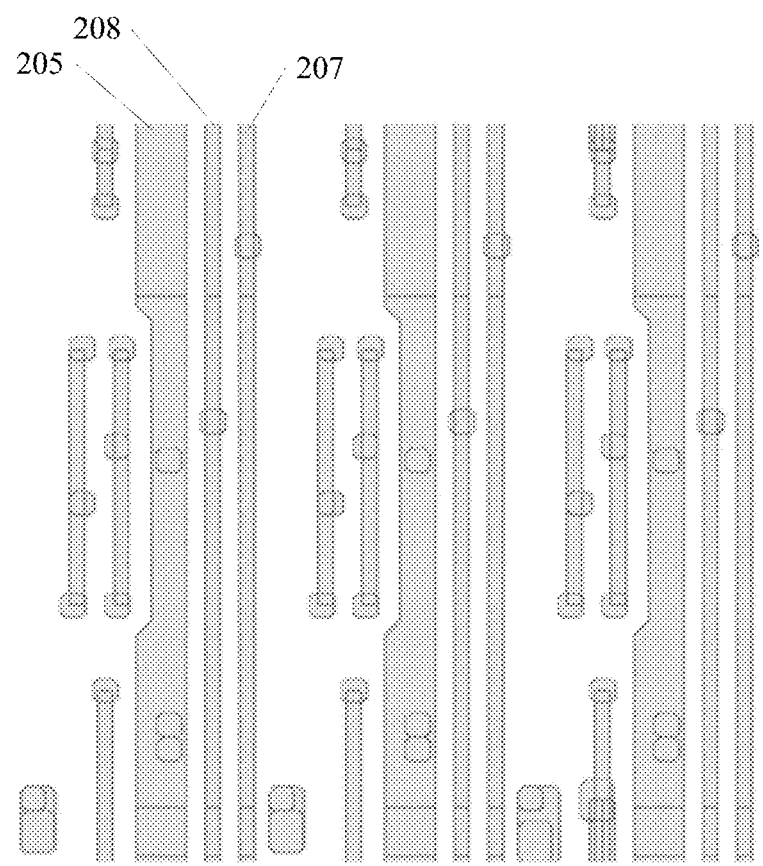

FIG. 7 illustrates an exemplary schematic of a layout of TFT and capacitor of a sub-pixel; and FIGS. 8 to 11 illustrate plan views of various layers in the layout of FIG. 7. Specifically, FIGS. 8 to 11 illustrate implementations of a same-layer wiring or semiconductor layer arrangement, wherein FIG. 8 is a plan view of the active layer 103, FIG. 9 is a plan view of the first gate layer, FIG. 10 is a plan view of the second gate layer, and FIG. 11 is a plan view of the second metal layer 119. In addition, FIG. 7 also includes a plan view of the first metal layer 110 in FIG. 2. The first gate layer herein is located between the first insulating layer 104 and the second insulating layer 106; the second gate layer is located between the second insulating layer 106 and the dielectric layer 108.

Referring to FIGS. 7 to 11, included in the figures are the reset signal line 201 for transmitting the reset signal Reset; the gate signal line 202 for transmitting the gate signal Gate; the light-emitting control signal line 203 for transmitting the light-emitting control signal EM; the reference voltage signal line 204 for transmitting the reference voltage signal Vref, and the first power signal line 205 for transmitting a high level, arranged in a row direction. The reset signal line 201, the gate signal line 202, and the light-emitting control signal line 203 herein are arranged in the first gate layer, and the reference voltage signal line 204 and the first power signal line 205 are arranged in the second gate layer.

Also included in FIG. 7 are the initialization voltage signal line 207 for transmitting the initialization voltage signal Vint; the data signal line 208 for transmitting the data signal Data; the first power signal line 205 for transmitting the first power signal VDD; the second power signal line 206 for transmitting a low level, arranged in a column direction. The initialization voltage signal line 207, the data signal line 208, and the first power signal line 205 herein are arranged on the second metal layer 119, and the second power signal line 206 is arranged on the first metal layer 110.

As shown in FIGS. 6 and 8, the driving transistor T3, the first reset transistor T1, the second reset transistor T7, the data write transistor T4, the first light-emitting control transistor T5, the second light-emitting control transistor T6, the second compensation transistor T9, the initialization transistor T8, and the first compensation transistor T2 can be formed along the active layer in FIG. 8. The active layer is in a curved or bent shape and includes an active layer AC-T8 of the initialization transistor T8, an active layer AC-T1 of the first reset transistor T1, an active layer AC-T2 of the first compensation transistor T2, an active layer AC-T3 of the driving transistor T3, an active layer AC-T6 of the second light-emitting control transistor T6, an active layer AC-T7 of the second reset transistor T7, an active layer AC-T4 of the data write transistor T4, an active layer AC-T9 of the second compensation transistor T9, and an active layer AC-T5 of the first light-emitting control transistor T5.

The active layer can include a polysilicon material, and includes a channel region, a source region, and a drain region. The channel region can be doped without impurities, and thus, it has semiconductor characteristics. The source and drain regions are on opposite sides of the channel region and are doped with impurities, and thus have conductivity. The impurities are changed depending on whether the transistor is P-type or N-type. The source and drain regions can be understood as the first or second pole of the transistor.

As shown in FIGS. 9 and 10, the energy storage capacitor includes a first energy storage capacitor plate 211 in the first gate layer and a second energy storage capacitor plate 212 in the second gate layer. The first energy storage capacitor plate 211 herein can serve as the gate of the driving transistor T3, and the second energy storage capacitor plate 212 can serve as the first or second pole of the second compensation transistor T9.

The present disclosure further provides a display device including the display panels provided by the embodiments of the present disclosure.

Figure 12:
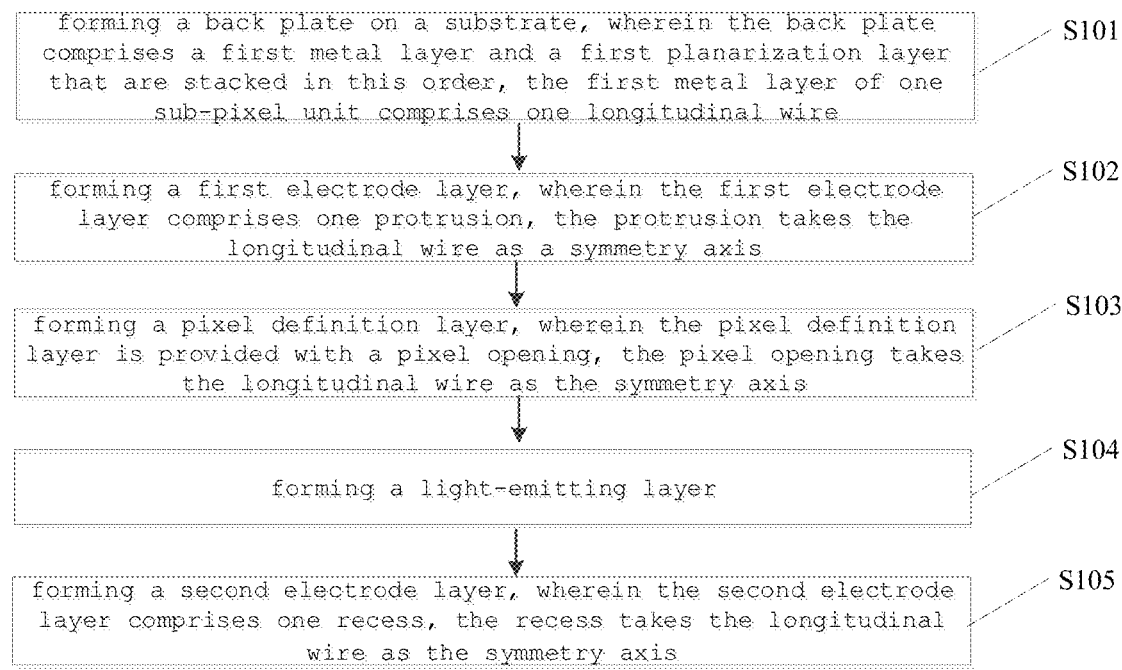
FIG. 12 illustrates an exemplary flowchart of a method of manufacturing a display panel according to an embodiment of the present disclosure.

The present disclosure further provides a method of manufacturing a display panel. As shown in FIG. 12, the manufacturing method includes the following steps:

step S101: forming a back plate on a substrate, wherein the back plate includes a first metal layer and a first planarization layer that are sequentially stacked in this order, and the first metal layer of one sub-pixel unit includes one longitudinal wire;

step S102: forming a first electrode layer, wherein the first electrode layer includes one protrusion, and the protrusion takes the longitudinal wire as a symmetry axis;

step S103: forming a pixel definition layer, wherein the pixel definition layer is provided with a pixel opening, and the pixel opening takes the longitudinal wire as the symmetry axis;

step S104: forming a light-emitting layer; and step S105: forming a second electrode layer, wherein the second electrode layer includes one recess, and the recess takes the longitudinal wire as the symmetry axis.

The above-described manufacturing process is explained below in combination with FIGS. 14 to 18. There are the sub-pixel unit 21 and the sub-pixel unit 22 included in the figures, and the sub-pixel unit 21 is taken as an example for explanation.

Figure 14:
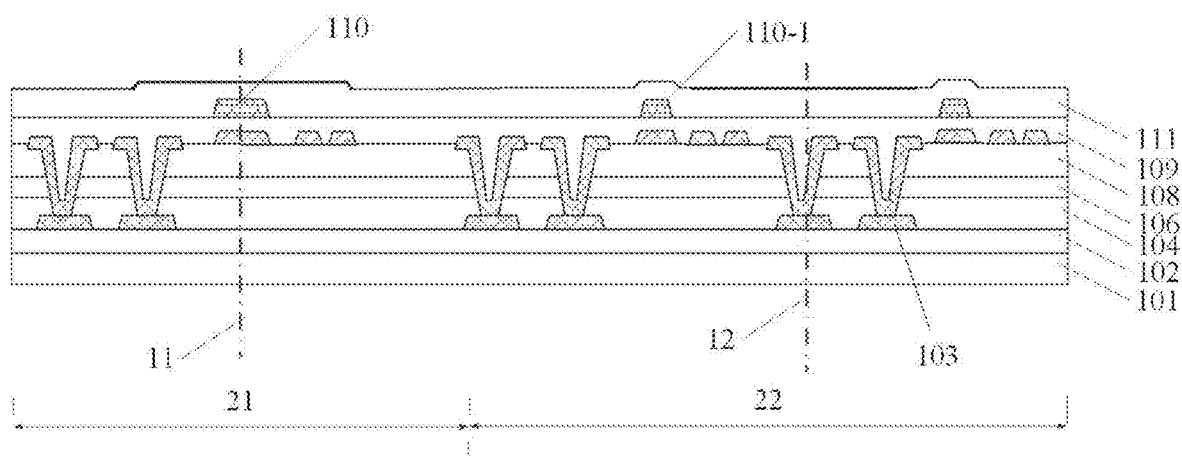
FIGS. 14 to 18 illustrate specific exemplary schematic diagrams according to the method of manufacturing the display panel in FIGS. 12 and 13.

As shown in FIG. 14, the back plate is formed on the substrate 101 and includes the first metal layer 110 and the first planarization layer 111 that are sequentially stacked in this order, and the first metal layer 110 of the sub-pixel unit 21 includes one longitudinal wire 110-1. The back plate herein includes the active layer 103, the first insulating layer 104, the first gate layer (not shown, and located between the first insulating layer 104 and the second insulating layer 106), the second insulating layer 106, the second gate layer (not shown, and located between the second insulating layer 106 and the dielectric layer 108), the dielectric layer 108, the second planarization layer 109, the first metal layer 110, and the first planarization layer 111, which are sequentially stacked in this order.

Figure 15:
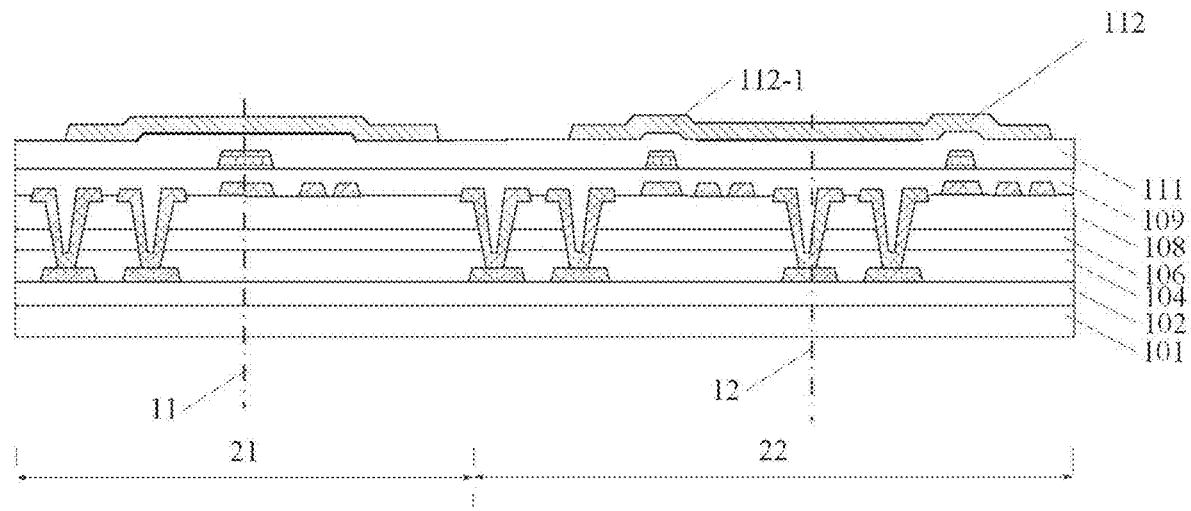

As shown in FIG. 15, the first electrode layer 112 is formed on the first planarization layer 111 in FIG. 14, and the first electrode layer includes one protrusion 112-1, and the protrusion 112-1 takes the center line 11 of the longitudinal wire as the symmetry axis.

Figure 16:
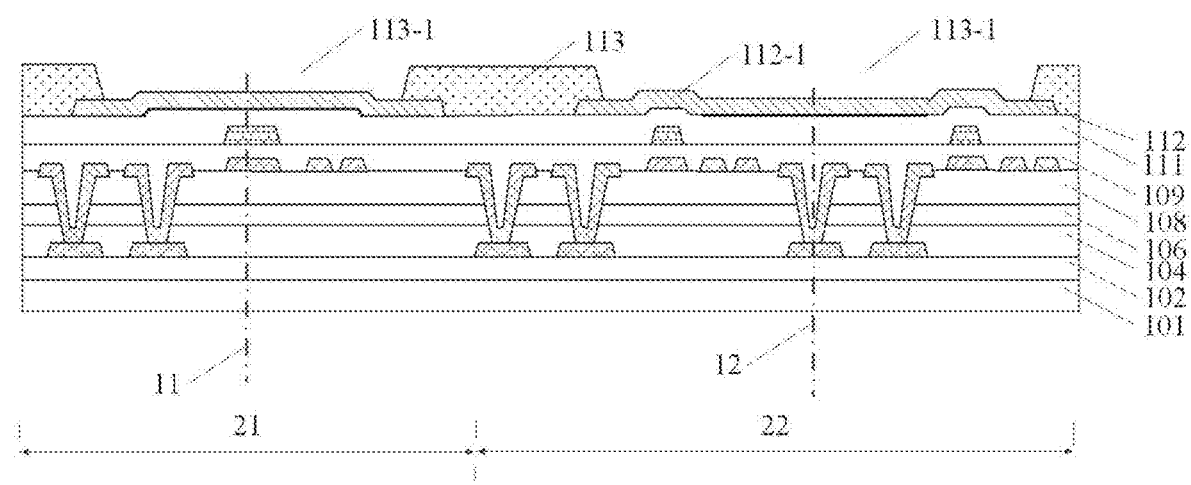

As shown in FIG. 16, the pixel definition layer 113 is formed on the first electrode layer 112 in FIG. 15, and the pixel definition layer 113 is provided with the pixel opening 113-1, which takes the center line 11 of the longitudinal wire as the symmetry axis.

Figure 17:
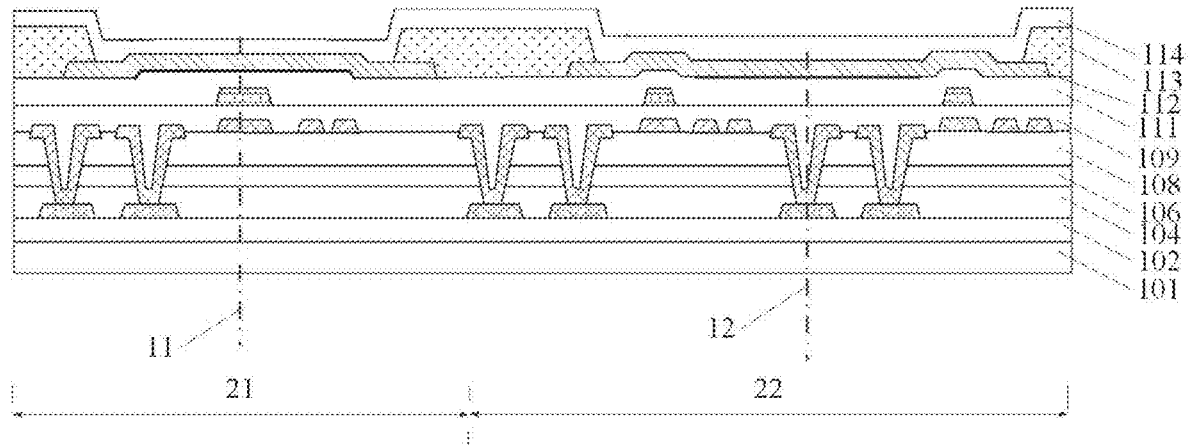

As shown in FIG. 17, the light-emitting layer 114 is formed on the pixel definition layer 113 in FIG. 16, and the light-emitting layer of the sub-pixel unit 21 has the symmetry structure with the center line 11 of the longitudinal wire as the symmetry axis.

Figure 18:
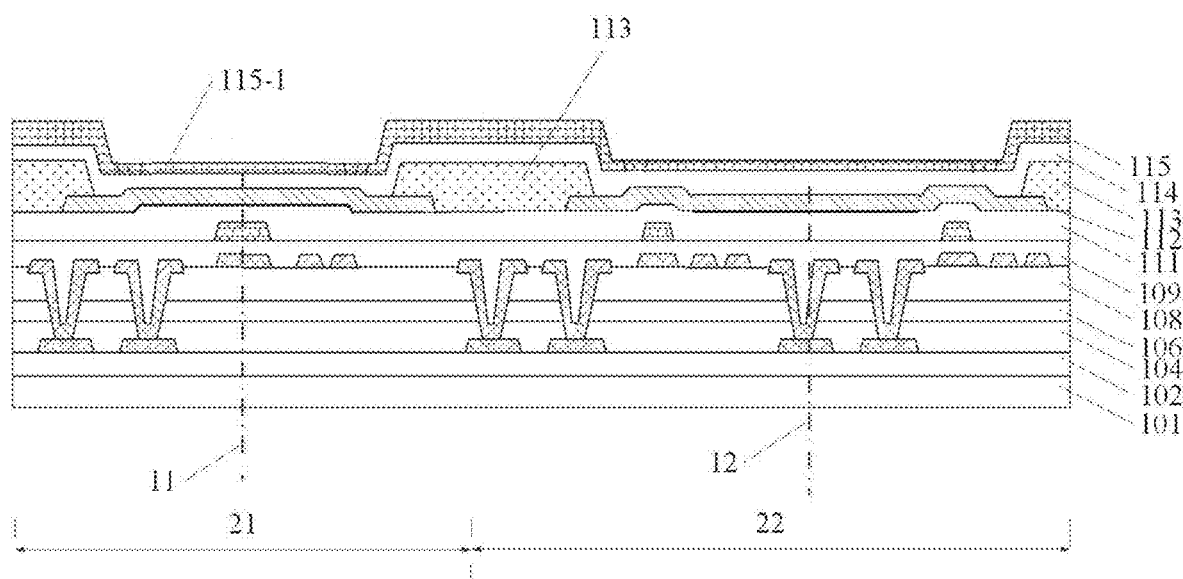

As shown in FIG. 18, the second electrode layer 115 is formed on the light-emitting layer 114 in FIG. 17, and the second electrode layer 115 includes one recess 115-1, which takes the center line 11 of the longitudinal wire as the symmetry axis.

As shown in FIG. 1, the display panel is formed after the encapsulation layer 116, the black matrix 117, and the color film 118 are formed in this order on the second electrode layer 115 as shown.

The method of forming various layers herein can employ existing process methods, and is not described herein again.

Figure 13:
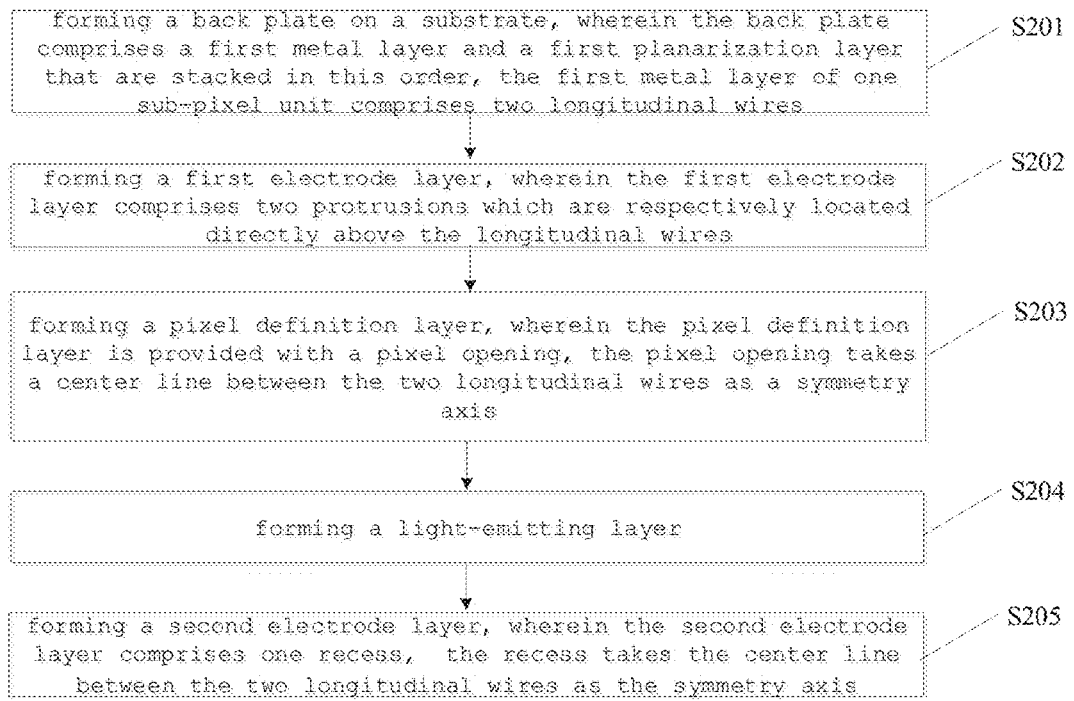
FIG. 13 illustrates an exemplary flowchart of a method of manufacturing a display panel according to another embodiment of the present disclosure.

The present disclosure further provides a method of manufacturing a display panel. As shown in FIG. 13, the manufacturing method includes the following steps:

step S201: forming a back plate on a substrate, wherein the back plate includes a first metal layer and a first planarization layer that are sequentially stacked in this order, and the first metal layer of one sub-pixel unit includes two longitudinal wires;

step S202: forming a first electrode layer, wherein the first electrode layer includes two protrusions which are respectively located directly above the longitudinal wires;

step S203: forming a pixel definition layer, wherein the pixel definition layer is provided with a pixel opening, and the pixel opening takes a center line between the two longitudinal wires as a symmetry axis;

step S204: forming a light-emitting layer; and step S205: forming a second electrode layer, wherein the second electrode layer includes one recess, and the recess takes the center line between the two longitudinal wires as the symmetry axis.

The above-described manufacturing process is explained below in combination with FIGS. 14 to 18. There are the sub-pixel unit 21 and the sub-pixel unit 22 included in the figures, and the sub-pixel unit 22 is taken as an example for explanation.

As shown in FIG. 14, the back plate is formed on the substrate and includes the first metal layer 110 and the first planarization layer 111 that are sequentially stacked in this order, and the first metal layer 110 of one sub-pixel unit 22 includes the two longitudinal wires 110-1. The back plate includes the active layer 103, the first insulating layer 104, the first gate layer (not shown, and located between the first insulating layer 104 and the second insulating layer 106), the second insulating layer 106, the second gate layer (not shown, and located between the second insulating layer 106 and the dielectric layer 108), the dielectric layer 108, the second planarization layer 109, the first metal layer 110, and the first planarization layer 111, which are sequentially stacked in this order.

As shown in FIG. 15, the first electrode layer 112 is formed on the first planarization layer 111 in FIG. 14, and the first electrode layer includes two protrusions 112-1 that take the center line 12 as the symmetry axis.

As shown in FIG. 16, the pixel definition layer 113 is formed on the first electrode layer 112 in FIG. 15, and the pixel definition layer 113 is provided with the pixel opening 113-1 that takes the center line 12 as the symmetry axis.

As shown in FIG. 17, the light-emitting layer 114 is formed on the pixel definition layer 113 in FIG. 16, and the light-emitting layer of the sub-pixel unit 21 has the symmetry structure with the center line 12 as the symmetry axis.

As shown in FIG. 18, the second electrode layer 115 is formed on the light-emitting layer 114 in FIG. 17, and the second electrode layer 115 includes one recess 115-1 that takes the center line 12 as the symmetry axis.

As shown in FIG. 1, the display panel is formed after the encapsulation layer 116, the black matrix 117, and the color film 118 are formed in this order on the second electrode layer 115 as shown.

It should be noted that each sub-pixel unit of the display panel can employ the structure including one longitudinal wire, or each sub-pixel unit can employ the structure including two longitudinal wires, or some sub-pixel units employ the structure including one longitudinal wire and other sub-pixel units employ the structure including two longitudinal wires. The above-described structure is not limited and is arranged according to the application.

The foregoing description only illustrate the embodiments of the present disclosure and the principles of the technology employed. It will be appreciated by those skilled in the art that the scope of the invention involved in the present disclosure is not limited to technical solutions formed by specific combinations of the above technical features, but encompasses other technical solutions formed by any combination of the above technical features or their equivalent features without departing from the inventive concept, for example, a technical solution formed by replacing the above features with the technical features disclosed (but not limited to) in the present disclosure and having similar functions.

What is claimed is:

1. A display panel comprising a plurality of sub-pixel units, each of the plurality of sub-pixel units comprises:
   a first metal layer, wherein the first metal layer comprises one longitudinal wire, and the first metal layer employs an axial symmetry structure;
   a first planarization layer;
   a first electrode layer, wherein the first electrode layer employs the axial symmetry structure;
   a pixel definition layer, wherein the pixel definition layer employs the axial symmetry structure;
   a light-emitting layer; and
   a second electrode layer, wherein the second electrode layer employs the axial symmetry structure;
   wherein the first metal layer, the first planarization layer, the first electrode layer, the pixel definition layer, the light-emitting layer and the second electrode layer are sequentially stacked; and
   wherein the longitudinal wire is taken as a symmetry axis of the axial symmetry structure,
   the first electrode layer of the sub-pixel unit comprises a protrusion, and the protrusion employs the axial symmetry structure.

2. The display panel according to claim 1, wherein the pixel definition layer of the sub-pixel unit comprises a pixel opening, and the pixel opening employs the axial symmetry structure with the longitudinal wire as the symmetry axis; and
   the second electrode layer of the sub-pixel unit comprises a recess, and the recess employs the axial symmetry structure with the longitudinal wire as the symmetry axis.

3. The display panel according to claim 2, wherein an orthographic projection of the pixel opening on the first metal layer of the sub-pixel unit covers the longitudinal wire.

4. A display panel comprising a plurality of sub-pixel units, each of the plurality of sub-pixel units comprises:
- a first metal layer, wherein the first metal layer comprises two longitudinal wires uniformly arranged side by side, and the first metal layer employs an axial symmetry structure;
- a first planarization layer;
- a first electrode layer, wherein the first electrode layer employs the axial symmetry structure;
- a pixel definition layer, wherein the pixel definition layer employs the axial symmetry structure;
- a light-emitting layer; and
- a second electrode layer, wherein the second electrode layer employs the axial symmetry structure;
- wherein the first metal layer, the first planarization layer, the first electrode layer, the pixel definition layer, the light-emitting layer and the second electrode layer are sequentially stacked; and
- a center line between the two longitudinal wires is taken as a symmetry axis of the axial symmetry structure, the first electrode layer of the sub-pixel unit comprises two protrusions located directly above the two longitudinal wires respectively.

5. The display panel according to claim 4, wherein the pixel definition layer of the sub-pixel unit comprises a pixel opening, the pixel opening employs the axial symmetry structure with the center line between the two longitudinal wires as the symmetry axis; and
- the second electrode layer of the sub-pixel unit comprises a recess, and the recess employs the axial symmetry structure with the center line between the two longitudinal wires as the symmetry axis.

6. The display panel according to claim 5, wherein an orthographic projection of the pixel opening on the first metal layer covers the two longitudinal wires.

7. A display device comprising the display panel according to claim 1.

8. The display device according to claim 7, wherein the pixel definition layer of the sub-pixel unit comprises a pixel opening, and the pixel opening employs the axial symmetry structure with the longitudinal wire as the symmetry axis; and
- the second electrode layer of the sub-pixel unit comprises a recess, and the recess employs the axial symmetry structure with the longitudinal wire as the symmetry axis.

9. The display device according to claim 8, wherein an orthographic projection of the pixel opening on the first metal layer of the sub-pixel unit covers the longitudinal wire.

10. A display device comprising the display panel according to claim 4.

11. The display device according to claim 10, wherein the pixel definition layer of the sub-pixel unit comprises a pixel opening, the pixel opening employs the axial symmetry structure with the center line between the two longitudinal wires as the symmetry axis; and
- the second electrode layer of the sub-pixel unit comprises a recess, and the recess employs the axial symmetry structure with the center line between the two longitudinal wires as the symmetry axis.

12. The display device according to claim 11, wherein an orthographic projection of the pixel opening on the first metal layer covers the two longitudinal wires.

* * * * *